(12) United States Patent  (10) Patent No.: US 6,549,268 B1
Nishi  (45) Date of Patent: Apr. 15, 2003

(54) EXPOSURE METHOD AND APPARATUS (75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/714,496

(22) Filed: Nov. 17, 2000

Related U.S. Application Data (63) Continuation of application No. PCT/JP99/03070, filed on Jun. 9, 1999.

(30) Foreign Application Priority Data

Jun. 17, 1998 (JP) .......................................... 10-169720

(51) Int. Cl.$^7$ .......................... G03B 27/42; G03B 27/62
(52) U.S. Cl. .......................................... 355/53; 355/75
(58) Field of Search .............................. 355/53, 67–77; 318/649; 310/10, 12; 378/37, 34

(56) References Cited

U.S. PATENT DOCUMENTS

| 5,208,497 A | * | 5/1993 | Ishii et al. ...................... 310/12 |
| 5,504,407 A | * | 4/1996 | Wakui et al. .......... 318/568.17 |
| 5,815,246 A | * | 9/1998 | Sperling et al. ............... 355/53 |
| 5,850,280 A | * | 12/1998 | Ohtomo et al. ............... 355/53 |
| 5,969,441 A | * | 10/1999 | Loopstra et al. ............... 310/12 |
| 6,084,673 A | | 7/2000 | Van Den Brink et al. .. 356/358 |
| 6,262,794 B1 | * | 7/2001 | Miyajima ..................... 355/53 |
| 6,323,935 B1 | * | 11/2001 | Ebihara et al. ............... 355/53 |

FOREIGN PATENT DOCUMENTS

| JP | A-5-136023 | 6/1993 |
| JP | A-8-111374 | 4/1995 |
| JP | A-8-130179 | 5/1996 |
| JP | A-8-148412 | 6/1996 |
| JP | A-9-153452 | 6/1997 |

* cited by examiner

*Primary Examiner*—Hung Henry Nguyen
(74) *Attorney, Agent, or Firm*—Oliff & Berridge PLC (57) ABSTRACT

An exposure apparatus and method exposes a substrate with an image of a pattern on a mask via a projection optical system. The exposure apparatus and method reduce the influence of the driving reaction force of the reticle stage and/or the wafer stage on, for example, the positioning accuracy of the reticle and the wafer so that exposure can be performed highly accurately. The exposure apparatus having a mask stage which includes a first stage member which is movable in a predetermined direction and a second stage member which is movable in the predetermined direction together with the first stage member while holding the mask and which is finely movable with respect to the first stage member in a plane parallel to a plane of the base member on which the mask stage is moved, so that a position of the mask is adjusted.

20 Claims, 7 Drawing Sheets

EXPOSURE METHOD AND APPARATUS

CROSS-REFERENCE

This is a Continuation of Application No. PCT/JP99/03070 filed Jun. 9, 1999. The entire disclosure of the prior application is hereby incorporated by reference herein in its entirety.

BACKGROUND ON THE INVENTION

1. Field of the Invention

The present invention relates to an exposure method and an apparatus for transferring a mask pattern onto a photosensitive substrate in the lithography step for producing, for example, semiconductor devices, image pickup devices (for example, CCD), liquid crystal display devices, or thin film magnetic heads. In particular, the present invention is preferably used for a scanning type exposure apparatus based on, for example, the so-called step-and-scan system for transferring a mask pattern onto a substrate by synchronously moving a mask and the substrate with respect to a projection optical system.

2. Description of the Related Art

For example, when a semiconductor device is produced, a projection exposure apparatus is used, in which an image of a pattern on a reticle as a mask is transferred to respective shot areas on a wafer (or a glass plate or the like) as a substrate applied with a resist. Conventionally, a projection exposure apparatus (stepper) of the full field exposure type (static exposure type) has been frequently used as the projection exposure apparatus. Recently, the attention is also attracted by a scanning exposure type projection exposure apparatus (scanning type exposure apparatus) such as those based on the step-and-scan system in which a reticle and a wafer are subjected to scanning in a synchronized manner with respect to a projection optical system.

In general, in the case of the projection exposure apparatus of the full field exposure type, if the vibration, which acts to incline the optical axis of the projection optical system, is generated by the driving reaction force caused, for example, when the wafer stage is subjected to stepping movement, the relative positional relationship between the reticle and the wafer is changed by the vibration during the exposure. As a result, for example, it is feared that any overlay error occurs. For this reason, the conventional projection exposure apparatus is designed as follows as described in Japanese Patent Application Laid-Open No. 5-136023. That is, a sensor for detecting the vibration is arranged, for example, for the reticle stage and the wafer stage, and the exposure is stopped until the vibration disappears, for example, on the basis of the vibration information fed from the sensor. Alternatively, the positional discrepancy amount between the reticle and the wafer is postulated from the detected amount of vibration. The driving is controlled, for example, for the reticle stage on the basis of the result of the postulation. By doing so, it is intended that the relative positional relationship between the reticle and the wafer is not changed during the exposure.

In the case of the conventional full field exposure type projection exposure apparatus, it is enough that the movement stroke of the reticle stage is short. Therefore, a laser interferometer based on the double-pass system, which radiates the measuring laser beam from a main interferometer body to a corner cube to serve as a movement mirror in two directions perpendicular to one another, has been used to detect the position of the reticle stage. When the corner cube is used as the movement mirror, the laser beam, which comes into the corner cube, returns along an optical path which is parallel to the incoming direction. Therefore, even when the reticle stage is rotated in a minute amount, the laser beam, which is returned from the corner cube, is not greatly deviated from the laser beam which is returned from the reference mirror fixed, for example, to the projection optical system. Therefore, an advantage is obtained such that the position of the reticle stage can be detected highly accurately.

As described above, in the case of the conventional projection exposure apparatus of the full field exposure type, the exposure is stopped until the vibration disappears on the basis of the vibration information fed from the sensor provided, for example, for the stage, or the positional discrepancy amount between the reticle and the wafer is corrected by means of the postulation control depending on the detected amount of the vibration. Thus, the influence of the driving reaction force of the wafer stage or the like is reduced. However, in the case of the scanning type exposure apparatus based on the step-and-scan system or the like, the exposure is performed while moving the reticle stage and the wafer stage. Therefore, it is impossible to stop the exposure until the vibration disappears. Further, it is difficult to perform the exposure while postulating the positional discrepancy amount between the reticle and the wafer from the amount of vibration.

In the case of the scanning type exposure apparatus, the reticle stage is moved over a wide range (approximately corresponding, for example, to the width of the reticle in the scanning direction) in the scanning direction. Therefore, it is impossible to use the corner cube for the movement mirror for measuring the position of the reticle stage in the non-scanning direction perpendicular to the scanning direction. In place of the corner cube, it is necessary to use a plane mirror having a length equivalent to the movement range of the reticle stage. In this case, if the distance between the plane mirror (movement mirror) and the reference mirror is long, for example, even when the laser interferometer based on the double-pass system is used, the laser beam, which is returned from the plane mirror, is deviated relatively greatly, when the reticle stage is rotate in a minute amount. It is feared that the position of the reticle stage cannot be detected. For this reason, in the case of the conventional scanning type exposure apparatus, in order to arrange the movement mirror and the reference mirror closely to one another, the reference mirror has been arranged on a reticle support stand in the vicinity of the movement mirror. In this arrangement, the vibration of the projection optical system is not directly reflected to the measured value of the laser interferometer. Therefore, an inconvenience arises such that it is impossible to highly accurately measure the relative positional relationship of the reticle on the basis of the projection optical system if the vibration is large.

In the case of the projection exposure apparatus of the full field exposure type, it is also necessary to use the plane mirror as the movement mirror when a structure, in which the movement amount of the reticle stage is large, is used. Therefore, the same inconvenience as described above arises.

Taking the foregoing points into consideration, a first object of the present invention is to provide an exposure apparatus and an exposure method which make it possible to highly accurately detect the relative positional relationship between the reticle stage and the projection optical system so that the reticle and the wafer may be subjected to highly accurate positional alignment, even when the movement range of the reticle stage is wide. A second object of the present invention is to provide an exposure apparatus and an exposure method which make it possible to reduce the influence of the driving reaction force of the reticle stage or the wafer stage on the positioning accuracy so that the exposure may be performed highly accurately.

Still another object of the present invention is to provide a method for producing the exposure apparatus as described above, and a method for producing a device, which makes it possible to produce the highly accurate device by using the exposure apparatus as described above.

SUMMARY OF THE OF THE INVENTION

A first exposure apparatus according to the present invention is an exposure apparatus for exposing a substrate (W) with an image of a pattern on a mask (R); comprising a projection optical system (5) which is arranged between the mask (R) and the substrate (W) and which projects the image of the pattern onto the substrate (W); a mask stage (9, 11) which holds and moves the mask (R); a mask base (14) which supports the mask stage (9, 11); and an interferometer (43X) which radiates a measuring light beam (LXM) onto the mask stage (9, 11) and radiates a reference light beam (LXR) onto a reference mirror (22X) arranged in the vicinity of the projection optical system (5) to detect a position of the mask stage (9, 11) on the basis of an interference light of the measuring light beam and the reference light beam; wherein a radiation position of the measuring light beam (LXM) on the mask stage (9, 11) is set to be deviated toward the projection optical system (5) with respect to a plane (14a) of the mask base on which the mask stage (9, 11) is moved.

According to the first exposure apparatus of the present invention as described above, the radiation position of the measuring light beam (for example, a movement mirror or a mirror surface) is set to be deviated toward the projection optical system with respect to the plane on which the mask stage (9, 11) is moved. Therefore, even when the reference mirror is arranged in the vicinity of the projection optical system (for example, on the upper side surface of a body tube of the projection optical system), the radiation position can be arranged closely to the reference mirror. Therefore, even when the projection optical system is displaced in a minute amount, or even when the mask stage is rotated in a minute amount, then it is possible to highly accurately detect the relative positional relationship between the mask stage and the projection optical system. Consequently, the mask and the substrate can be subjected to highly accurate positional adjustment.

It is desirable that the exposure apparatus is an exposure apparatus of a scanning exposure type, and the interferometer (43X) is an interferometer which measures the position of the mask stage in a non-scanning direction perpendicular to a scanning direction.

It is desirable that the exposure apparatus further comprises a support member (15) which supports the mask base (14) and the projection optical system (5). It is desirable that the support member (15) supports the interferometer (43X).

It is desirable that the mask base (14) has an opening for projecting the pattern, and at least a part of the projection optical system (5) is located at the inside of the opening.

In another aspect, a second exposure apparatus according to the present invention is an exposure apparatus for exposing a substrate (W) with an image of a pattern on mask (R) via a projection optical system (5); comprising a mask stage (9, 11) which is supported movably with respect to a base member (14) and which is movable in a predetermined direction while holding the mask (R); a mask side reaction force-reducing member (13) which is supported movably with respect to the base member (14) at the outside of the mask stage (9, 11) and which is movable to offset any reaction force generated when the mask stage (9, 11) is driven; and a driving member (12) which is arranged between the mask stage (9, 11) and the mask side reaction force-reducing member (13) and which drives the mask stage (9, 11); wherein the mask stage (9, 11) includes a first stage member (11) which is movable in a predetermined direction; and a second stage member (9) which is movable in the predetermined direction together with the first stage member (11) while holding the mask (R) and which is finely movable with respect to the first stage member (11) in a plane parallel to a plane (14a) of the base member (14) on which the mask stage (9, 11) is moved, so that a position of the mask (R) is adjusted.

According to the second exposure apparatus of the present invention as described above, when the mask stage is driven in the predetermined direction by the aid of the driving member (12), for example, the mask side reaction force-reducing member (13) is moved in the opposite direction in accordance with the law of action and reaction. The movement of the center of gravity almost disappears as a whole, and no vibration is caused. Therefore, it is possible to reduce the influence of the driving reaction force of the mask stage, for example, on the positioning accuracy, and it is possible to perform the exposure highly accurately.

The mask stage and the mask side reaction force-reducing member are supported by the common base member. Accordingly, the mask side reaction force-reducing member can be installed to the exposure apparatus without increasing the distance between the mask and the projection optical system. Therefore, the mask side reaction force-reducing member can be installed with ease even for an exposure apparatus in which at least one width of the illumination area is large, and the distance between the mask and the projection optical system (working distance on the mask side) is short.

The position of the mask can be also adjusted during the movement of the mask by finely driving the second stage member (9) with respect to the first stage member (11). For example, when the scanning exposure is performed, it is possible to highly accurately correct the synchronization error between the mask and the substrate.

It is desirable that a mass of the mask side reaction force-reducing member (13) is not less than five times a mass of the mask stage (9, 11).

In still another aspect, a third exposure apparatus according to the present invention is an exposure apparatus for exposing a substrate (W) with an image of a predetermined pattern via a projection optical system (5); comprising a substrate stage (3) which holds and moves the substrate (W); and a substrate side reaction force-reducing member (2) which is supported movably with respect to a base member (30), which movably supports the substrate stage (3), and which is movable to offset any reaction force generated when the substrate stage (3) is driven; wherein a mass of the substrate side reaction force-reducing member (2) is not less than five times a mass of the substrate stage (3).

According to the third exposure apparatus of the present invention as described above, for example, when the substrate stage is driven by the driving member between the substrate side reaction force-reducing member (2) and the substrate stage (3), for example, the substrate side reaction force-reducing member is moved in the opposite direction in accordance with the law of action and reaction. Therefore, the movement of the center of gravity almost disappears as a whole, and hence it is possible to reduce the influence of the driving reaction force of the substrate stage, for example, on the positioning accuracy.

Further, it is possible to reduce the influence of the driving reaction force on the exposure apparatus during the driving of the stage system without increasing the foot print (installation area) even for the stage system which is moved over a range that is wide in the two-dimensional direction as in the substrate stage by movably supporting the substrate stage, for example, on the substrate side reaction force-reducing member and movably supporting the substrate side-reaction force-reducing member on the base member.

Further, the mass of the substrate side reaction force-reducing member is not less than five times the mass of the substrate stage. Therefore, the following advantage is obtained. That is, it is easy to increase the relative velocity of the substrate stage with respect to the base member, and it is possible to decrease the driving amount of the substrate side reaction force-reducing member.

It is desirable that the exposure apparatus further comprises a support member (15) which supports the base member (30) and the projection optical system (5).

In still another aspect, a fourth exposure apparatus according to the present invention is an exposure apparatus for exposing a substrate (W) with an image of a pattern on a mask (R); comprising a projection optical system (5) which is arranged between the mask (R) and the substrate (W) and which projects the image of the pattern onto the substrate (W); a mask stage (9, 11) which is movable while holding the mask (R); and a mask base (14) which movably supports the mask stage (9, 11) and which is provided with an opening for projecting the image of the pattern; wherein the mask stage (9, 11) holds the mask (R) so that a pattern plane of the mask (R) is located at a position deviated toward the projection optical system (5) with respect to a plane (14a) of the mask base (14) on which the mask stage (9, 11) is moved, and at least a part of the projection optical system (5) is located at the inside of the opening.

According to the fourth exposure apparatus of the present invention as described above, the pattern plane of the mask (R) is located at the position deviated toward the projection optical system (5) with respect to the plane of the mask base (14) on which the mask stage (9, 11) is moved. Therefore, the mask (R) and the projection optical system (5) can be arranged closely to one another, and the working distance on the side of the mask (R) can be designed to be short. Further, the portion of the mask stage (9, 11) for holding the mask (R) is located at the position deviated toward the projection optical system (5) with respect to the plane (14a) on which the mask stage is moved. Therefore, when a movement mirror for detecting the position of the mask stage (9, 11) is installed at the portion for holding the mask (R), it is easy to realize the first exposure apparatus of the present invention.

It is desirable that the exposure apparatus further comprises a movement unit which is movably supported by the mask base (14) and which is movable in an opposite direction with respect to the mask stage (9, 11).

In still another aspect, a first exposure method according to the present invention is an exposure method for exposing a substrate (W) with an image of a pattern on a mask (R) via a projection optical system (5) arranged between the mask (R) and the substrate (W), the exposure method comprising using a mask stage (9, 11) including a first stage (11) which is movable in a predetermined direction and a second stage (9) which is movable together with the first stage (11) while holding the mask (R); radiating a measuring light beam (LXM) onto a position deviated toward the projection optical system (5) from a plane (14a) of a mask base (14) which supports the mask stage (9, 11) and on which the mask stage (9, 11) is moved; and radiating a reference light beam (LXR) to a reference mirror (22X) arranged in the vicinity of the projection optical system (5) so that a position of the mask stage (9, 11) is detected on the basis of an interference light of the measuring light beam and the reference light beam.

According to the first exposure method of the present invention as described above, it is possible to highly accurately detect the positional relationship between the mask stage and the projection optical system. Consequently, it is possible to effect the highly accurate positional adjustment for the mask and the substrate.

In still another aspect, a second exposure method according to the present invention is an exposure method for exposing a substrate (W) with an image of a pattern on a mask (R) via a projection optical system (5); comprising moving a mask stage (9, 11) including a first stage member (11) which is supported movably with respect to a base member and a second stage member (9) which is movable together with the first stage member (11) which holds the mask (R), while moving a mask side reaction force-reducing member (13), which is supported movably with respect to the base member (14) and which is arranged at the outside of the first stage member (11), to offset any driving reaction force of the mask stage (9, 11); and finely moving the second stage member (9) with respect to the first stage member (11) in a plane which is parallel to a plane (14a) of the base member (14) on which the mask stage (9, 11) is moved so that a position of the mask (R) is adjusted.

According to the second exposure method of the present invention as described above, no vibration is caused when the mask stage is driven in a predetermined direction. Therefore, it is possible to reduce the influence of the driving reaction force of the mask stage, for example, on the positioning accuracy. Thus, it is possible to perform the exposure highly accurately.

The position of the mask can be also adjusted during the movement of the mask (R) by finely driving the second stage member (9) with respect to the first stage member (11).

In still another aspect, a third exposure method according to the present invention is an exposure method for exposing a substrate (W) with an image of a predetermined pattern via a projection optical system (5); comprising driving a substrate stage (3) which holds and moves the substrate (W), wherein a substrate side reaction force-reducing member (2), which has a mass of not less than five times that of the substrate stage (3), which is supported movably with respect to a base member (30), and which movably supports the substrate stage (3), is moved to offset any driving reaction force of the substrate stage (3).

According to the third exposure method of the present invention as described above, the center of gravity is scarcely moved as a whole. Therefore, it is possible to reduce the influence of the driving reaction force of the substrate stage, for example, on the positioning accuracy. Further, it is possible to reduce the influence of the driving reaction force on the exposure apparatus when the stage system is driven, without increasing the foot print (installation area), even in the case of the stage system such as the substrate stage which is moved over a wide range in two-dimensional directions. Further, it is easy to increase the relative velocity of the substrate stage with respect to the base member, and it is advantageous to decrease the driving amount of the substrate side reaction force-reducing member.

In still another aspect, a fourth exposure method according to the present invention is an exposure method for exposing a substrate (W) with an image of a pattern on a mask (R) via a projection optical system (5) arranged between the mask (R) held on a movable mask stage (9,11) and the substrate (W); the exposure method comprising locating a pattern plane of the mask (R) at a position deviated toward the projection optical system (5) from a plane (14a) of a mask base (14) which supports a mask stage (9, 11) and on which the mask stage (9, 11) is moved, wherein at least a part of the projection optical system (5) is disposed in an opening formed in the mask base (14).

According to the fourth exposure method of the present invention as described above, the pattern plane of the mask (R) is located at the position deviated toward the projection optical system (5) from the plane of the mask base (14) on which the mask stage (9, 11) is moved. Therefore, the mask (R) and the projection optical system (5) can be arranged closely to one another. It is possible to design the working distance on the side of the mask (R) to be short.

In still another aspect, a first method for producing an exposure apparatus according to the present invention is a method for producing an exposure apparatus for exposing a substrate (W) with a pattern on a mask (R) via a projection optical system (5), the method comprising assembling the following components in a predetermined positional relationship, i.e., a mask stage (9, 11) including a first stage (11) which is movable in a predetermined direction and a second stage (9) which is movable together with the first stage (11) while holding the mask (R); a mask base (14) which supports the mask stage (9, 11); and an interferometer (43X) which radiates, for the mask stage (9, 11), a measuring light beam (LXM) onto a position deviated toward the projection optical system (5) from a plane (14a) of the mask base (14) on which the mask stage (9, 11) is moved, and which radiates a reference light beam (LXR) onto a reference mirror (22X) arranged in the vicinity of the projection optical system (5) so that a position of the mask stage (9, 11) is detected on the basis of an interference light of the measuring light beam and the reference light beam.

In still another aspect, a second method for producing an exposure apparatus according to the present invention is a method for producing an exposure apparatus for exposing a substrate (W) with an image of a pattern on a mask (R) via a projection optical system (5), the method comprising assembling the following components in a predetermined positional relationship, i.e., a mask stage (9, 11) including a first stage member (11) which is movable in a predetermined direction and a second stage member (9) which is movable in the predetermined direction together with the first stage member (11) while holding the mask (R) and which is finely movable with respect to the first stage member (11) in a plane parallel to a plane (14a) on which the first stage member (11) is moved to adjust a position of the mask (R); a mask side reaction force-reducing member (13) which is movable to offset any reaction force generated when the mask stage (9, 11) is driven, at the outside of the mask stage (9, 11); and a driving member which is arranged between the mask stage (9, 11) and the mask side reaction force-reducing member (13) and which drives the mask stage (9, 11).

In still another aspect, a third method for producing an exposure apparatus according to the present invention is a method for producing an exposure apparatus for exposing a substrate (W) with an image of a predetermined pattern via a projection optical system (5), the method comprising assembling the following components in a predetermined positional relationship, i.e., a substrate stage (3) which holds and moves the substrate (W); and a substrate side reaction force-reducing member (2) which has a mass of not less than five times that of the substrate stage (3), which is supported movably with respect to a base member (30), which movably supports the substrate stage (3), and which is movable to offset any reaction force generated when the substrate stage (3) is driven.

In still another aspect, a fourth method for producing an exposure apparatus according to the present invention is a method for producing an exposure apparatus for exposing a substrate (W) with an image of a pattern on a mask (R), the method comprising arranging a projection optical system (5) at such a position between the mask and the substrate as to project the image of the pattern onto the substrate (W); arranging a base member (14) which has a predetermined movement plane (14); and arranging a mask stage (9, 11) including a first stage (11) which is movable in a predetermined direction and a second stage (9) which is movable together with the first stage (11) while holding the mask (R) so that a pattern plane of the mask (R) is located at a position deviated toward the projection optical system (5) from the movement plane (14a).

In still another aspect, a method for producing a device according to the present invention is a method for producing a predetermined device, comprising the step of transferring, by exposure, a pattern onto a substrate (W) by using the exposure apparatus of the present invention. According to the method for producing the device of the present invention as described above, the mask and the substrate are subjected to the highly accurate positional adjustment by using the exposure apparatus of the present invention. As a result, it is possible to obtain the high performance device.

DETAILED DESCRIPTION OF THE PREFERRED EMBODIMENT

A preferred exemplary embodiment of the present invention will be explained below with reference to the drawings.

In this embodiment, the present invention is applied to a projection exposure apparatus based on the step-and-scan system.

Figure 1:
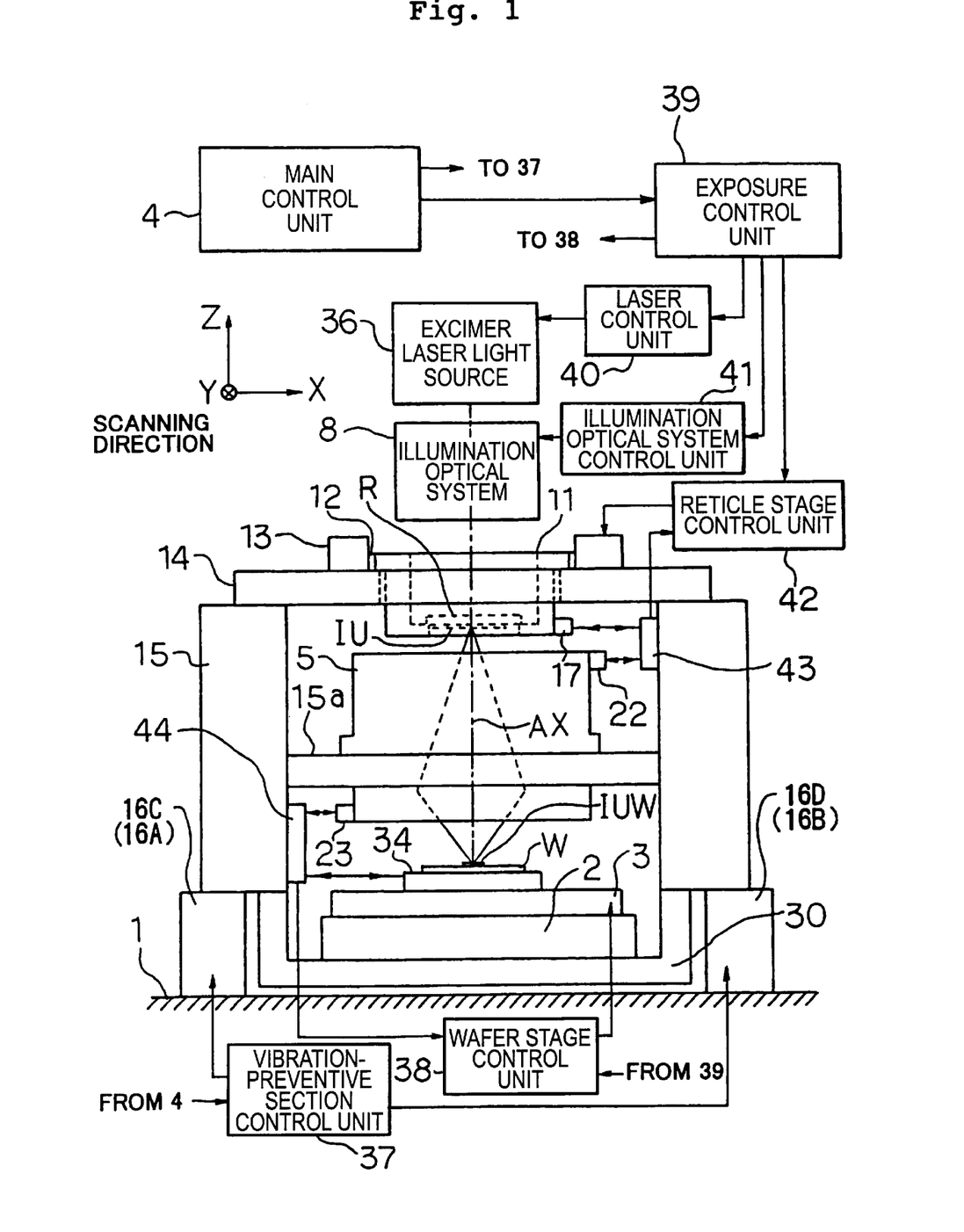
FIG. 1 shows a schematic arrangement illustrating a projection exposure apparatus to be used in an exemplary embodiment of the present invention.

FIG. 1 shows a schematic arrangement of the projection exposure apparatus of this embodiment. With reference to FIG. 1, an exposure light beam is composed of an ultraviolet pulse laser beam which is radiated from an excimer laser light source 36 as an exposure light source controlled for the oscillation frequency and the light amount by a laser control unit 40. The exposure light beam passes through an illumination optical system 8 which is constructed, for example, by a fly's eye lens, an aperture diaphragm, a field diaphragm (fixed field diaphragm and movable field diaphragm), and a condenser lens. The exposure light beam illuminates, with uniform illuminance distribution, a rectangular illumination area IU of a pattern plane (lower surface) of a reticle R. The switching operation for the aperture diaphragm of the illumination optical system 8, and the opening/closing operation for the movable field diaphragm in synchronization with a stage system are controlled by an illumination optical system control unit 41. For example, a KrF excimer laser light source (wavelength: 248 nm) or an ArF excimer laser light source (wavelength: 192 nm) is used for the excimer laser light source 36. However, it is also preferable to use, as the exposure light source, for example, an $F_2$ laser light source (wavelength: 157 nm) or an $Ar_2$ laser light source (wavelength: 126 nm) having a shorter wavelength. The present invention is also applicable when the i-ray of a mercury lamp or the extreme ultraviolet light beam (EUV light beam) is used as the exposure light beam. The operations of the laser control unit 40 and the illumination optical system control unit 41 are controlled by an exposure control unit 39 which controls the entire exposure operation. The operation of the exposure control unit 39 is controlled by a main control unit 4. A part of the illumination optical system 8 may be supported by a column 15.

Under the exposure light beam, the pattern in the illumination area IU on the reticle R is subjected to reduction projection onto a rectangular exposure area IUW in one shot area on a wafer W applied with photoresist at a predetermined projection magnification β (β is, for example, ¼ or ⅕) via a projection optical system 5 which is telecentric on both sides (or one side on the wafer side). The following explanation will be made assuming that the Z axis is parallel to the optical axis AX of the projection optical system 5, the X axis is parallel to the plane of the paper of FIG. 1 in a plane perpendicular to the optical axis AX, and Y axis is perpendicular to the plane of the paper of FIG. 1.

At first, the reticle R is held by a finely movable stage 9 (see FIG. 2) disposed at the inside of a reticle stage 11. The reticle stage 11 is placed movably in the Y direction on a reticle base 14 which is fixed on the column 15. The column 15 is installed on the floor 1 at four corners of the bottom surface by the aid of vibration-preventive pedestals 16A to 16D. A reticle frame 13, which serves as the mask-side reaction force-reducing member and which is movable in the direction to offset the reaction force generated when the reticle stage 11 is driven, is supported movably in the Y direction on the reticle base 14 so that the outer portion of the reticle stage 11 is surrounded thereby. A pair of linear motors 12 for moving the reticle stage 11 in the Y direction are installed between the reticle stage 11 and the reticle frame 13. Further, four EI core type driving members 10 (see FIG. 2), which are expandable and contractible to finely move the finely movable stage 9 with the reticle R accommodated therein in the X direction, the Y direction, and the rotational direction about the axis parallel to the Z axis, are also incorporated in the reticle stage 11. A plurality of sets of laser interferometers 43, movement mirrors 17, and reference mirrors 22 fixed on the upper side surface of the body tube of the projection optical system 5 are used to highly accurately measure the position of the reticle stage 11 (reticle R) on the basis of the projection optical system 5. Obtained results of the measurement are supplied to a reticle stage control unit 42 which controls the position and the movement velocity of the reticle stage 11.

On the other hand, the wafer W is fixed on the sample base 34 by the aid of an unillustrated wafer holder. The sample base 34 is placed movably in the X direction and in the Y direction on the wafer stage 3. The wafer stage 3 is placed movably in the Y direction on a wafer frame 2 which serves as the substrate side reaction force-reducing member that is movable in the direction to offset the reaction force generated when the sample base 34 is driven. The wafer frame 2 is placed movably in the X direction and in the Y direction on a wafer base 30. The wafer base 30 is fixed to the bottom surface of the column 15 for supporting the reticle base 14 so that the wafer base 30 hangs therefrom. The side surface of the sample base 34 is mirror-finished (to serve as the movement mirror). A plurality of sets of laser interferometers 44, mirror surfaces as movement mirrors therefor, and reference mirrors 23 provided on the lower side surface of the body tube of the projection optical system 5 are used to highly accurately measure the position of the sample base 34 (wafer 34). Obtained measured values are supplied to a wafer stage control unit 38 for controlling the position and the movement velocity of the sample base 34.

The projection optical system 5 is fixed, by the aid of a flange, to a middle plate 15a of the column 15 to which the reticle base 14 and the wafer base 30 are fixed. The vibration-preventive pedestals 16A to 16D, which support the column 15, are also provided with electromagnetic dampers for actively attenuating the vibration with electromagnetic actuators so that the vibration from the floor 1 is not transmitted to the main body section of the projection exposure apparatus, together with pneumatic or hydraulic passive vibration-preventive mechanisms.

The exposure control unit 39 also manages the operations of the reticle stage control unit 42 and the wafer stage control unit 38. The exposure control unit 39 controls a series of scanning exposure operations on the basis of the command of the main control unit 4. In order to avoid any transmission of the vibration from the floor 1 to the main body section of the projection exposure apparatus, the main control unit 4 suppresses the vibration of the column 5, while making the feedback control for the electromagnetic dampers in the vibration-preventive pedestals 16A to 16D by the aid of a vibration-preventive section control unit 37 on the basis of results of the measurement performed by an unillustrated position sensor and an acceleration sensor installed for the column 15.

The projection exposure apparatus of this embodiment is assembled by connecting the foregoing constitutive components electrically, mechanically, or optically so that the foregoing functions are achieved.

During the scanning exposure, the reticle stage 11 is used to move the reticle R at a velocity $V_R$ in the +Y direction (or in the −Y direction) with respect to the illumination area IU, in synchronization with which the wafer stage 3 is used to move the sample base 34 (wafer W) at a velocity $\beta \cdot V_R$ (β is the projection magnification from the reticle R to the wafer W) in the −Y direction (or in the +Y direction) with respect to the exposure area IUW. Accordingly, the pattern image in the pattern area on the reticle R is successively transferred to one shot area on the wafer W. During this process, as described later on, the reticle frame 13 is driven in the −Y direction (or in the +Y direction), and the wafer frame 2 is driven in the +Y direction (or in the −Y direction) so that the driving reaction forces of the reticle stage 11 and the wafer stage 3 are offset respectively. After completion of the exposure for one shot area, the sample base 34 is subjected to stepping to move the next shot area on the wafer to the scanning start position so that the scanning exposure is performed. The foregoing operation is repeated in accordance with the step-and-scan system. Thus, the exposure is performed for the respective shot areas on the wafer W.

Next, explanation will be made with reference to FIGS. 2 and 3 for the laser interferometers 43, 44 of the projection exposure apparatus of this embodiment.

Figure 2:
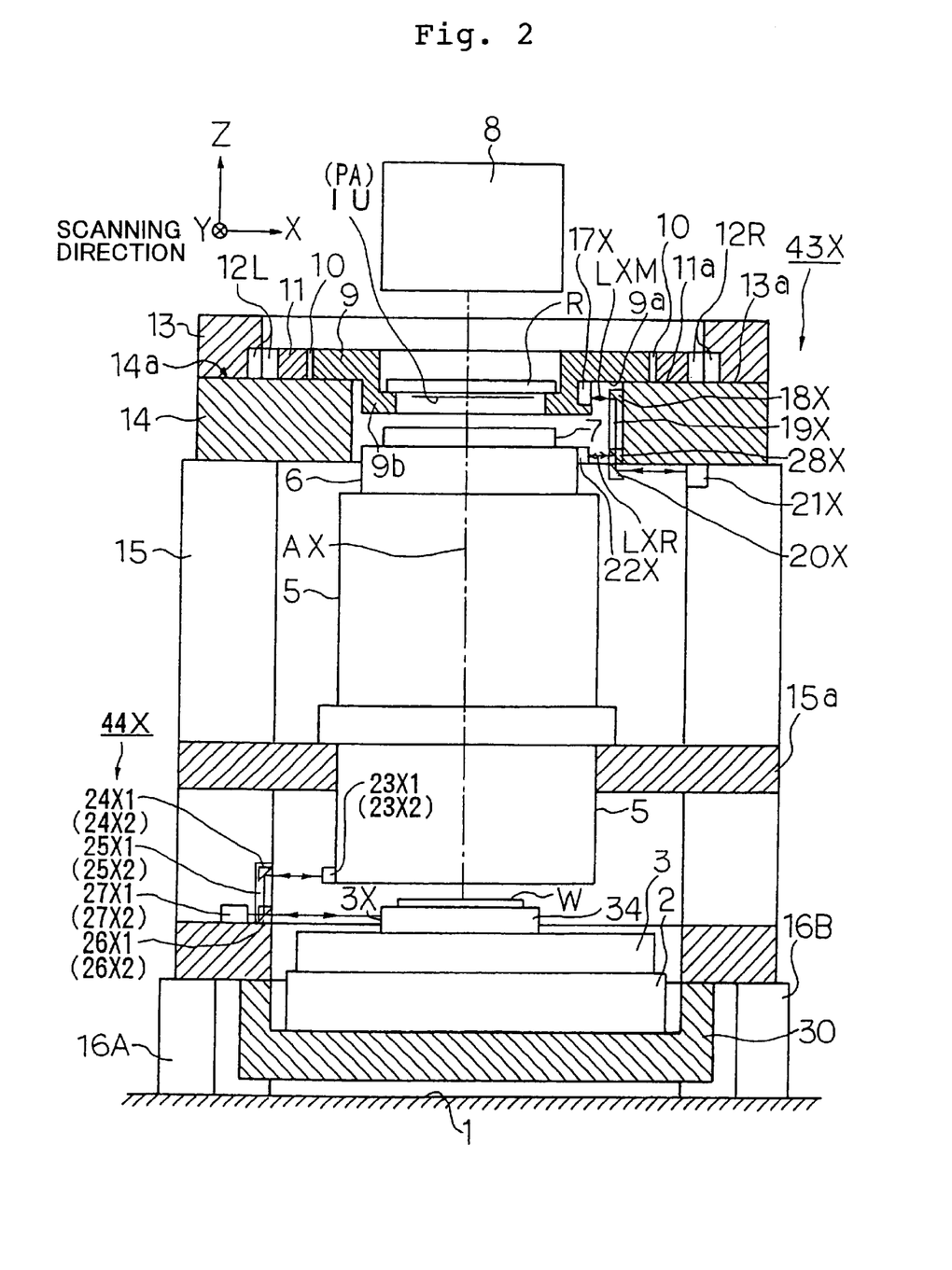
FIG. 2 shows a partial sectional view illustrating a finely movable stage 9 and a laser interferometer for detecting the position of a sample base 34 in the X direction.

FIG. 2 shows a sectional view obtained by cutting a part of the projection exposure apparatus of this embodiment along a plane perpendicular to the Y axis. In FIG. 2, the reticle R is attracted and held by means of vacuum attraction (or electrostatic attraction or the like) by an attracting section 9b of a central recess of the finely movable stage 9 disposed at the inside of the reticle stage 11. The finely movable stage 9 is movable on a movement plane 14a which is the upper surface of the reticle base 14, together with the reticle stage 11. A plane mirror 17X, which serve as a movement mirror, is installed on a side surface in the +X direction at a projection of the bottom surface of the finely movable stage 9 so that the plane mirror 17X is disposed at a position lower than the finely movable stage 9 and the movement plane 14a of the reticle stage 11. A telecentric control unit 6 which accommodates a lens for controlling the telecentric performance on the reticle side, and a parallel plane glass piece 7 which is processed to have irregularities or the like for correcting the distortion are provided at upper portions of the projection optical system 5. The working distance on the side of the reticle R has been shorter than that of the conventional system. The column 15 integrally holds the reticle base 14 and the projection optical system 5. Accordingly, the apparatus is constructed such that the working distance can be shortened as compared with a case in which the reticle base 14 and the projection optical system 5 are supported in a separate manner. Therefore, the upper portion of the telecentric control unit 6 and the parallel plane glass piece 7 are accommodated in the central opening of the reticle base 14. A reference mirror 22X, which is composed of a plane mirror, is fixed to a side surface in the +X direction at the upper end of a body tube of the telecentric control unit 6. The position of the finely movable stage 9 (reticle R) in the X direction is measured by the laser interferometer 43X for the X axis, the plane mirror 17X, and the reference mirror 22X. In the embodiment of the present invention, the telecentric control unit 6 and the parallel plane glass piece 7 constitute a part of the projection optical system 5. The laser interferometer 43X is a laser interferometer based on the double-pass system comprising a main laser interferometer body 21X provided on the column 15, a mirror 20X, a polarizing beam splitter 28X, a light-feeding optical member 19X including an unillustrated mirror and the like, and a mirror 18X. An interferometer based on the single pass system may be used, for example, for the laser interferometer 43X.

On the other hand, a side surface in the −X direction of the sample base 34 on the wafer stage 3 is processed to have a mirror surface 3X. The mirror surface 3X is used as a movement mirror for measuring the position of the sample base 34 in the X direction. Reference mirrors 23X1, 23X2, which are composed of plane mirrors, are fixed at a predetermined spacing distance in the Y direction to a lower side surface of the body tube of the projection optical system 5. The position of the sample base 34 in the X direction is measured by a laser interferometer 44X, the mirror surface 3X of the sample base 34, and the reference mirrors 23X1, 23X2. The laser interferometer 44X is composed of two sets of interferometers (see FIG. 4) so that not only the position of the sample base 34 (wafer W) in the X direction but also the angle of rotation about the axis parallel to the Z axis may be measured. That is, the laser interferometer 44X is a laser interferometer based on the double-pass system comprising laser interferometer main bodies 27X1, 27X2 provided on the column 15, polarizing beam splitters 26X1, 26X2, light-feeding optical members 25X1, 25X2, and mirrors 24X1, 24X2. Measured values obtained by the main laser interferometer bodies 27X1, 27X2 are supplied to the wafer stage control unit 38 shown in FIG. 1. For example, the wafer stage control unit 38 calculates an average value of the measured values to give the position of the sample base in the X direction. A differential value between the measured values is used to calculate the angle of rotation of the sample base 34.

Explanation will now be made for the process in which the laser interferometer 43X is used to detect the position of the reticle stage 11 in the X direction (non-scanning direction). At first, the laser beam is radiated in the −X direction from the main laser interferometer body 21X to the mirror 20X. The laser beam is reflected in the +Z direction by the mirror 20X. A reference laser beam LXR, which is a first polarization component of the laser beam reflected by the mirror 20X, is reflected by the polarizing beam splitter 28X along the X axis toward the reference mirror 22X. A measuring laser beam LXM, which is a second polarization component, is transmitted through the polarizing beam splitter 28X. The measuring laser beam LXM passes through the light-feeding optical member 19X, and it is reflected by the mirror 18X along the X axis toward the plane mirror 17X. The reference laser beam LXR reflected by the reference mirror 22X, and the measuring laser beam LXM reflected by the plane mirror 17X and the mirror 18X pass through the polarizing beam splitter 28X respectively to be coaxially combined to give an interference light beam (heterodyne light beam in this embodiment). The interference light beam passes through the mirror 20X, and it is returned to the main laser interferometer body 21X. The main laser interferometer body 21X counts the photoelectric conversion signal of the interference light beam. Thus, the position of the plane mirror 17X in the X direction at the point of radiation of the measuring laser beam LXM is detected as a relative position on the basis of the reference mirror 22X.

Actually, an optical unit for the double-pass is incorporated into each of the polarizing beam splitter 28X and the mirror 18X. Each of the reference laser beam LXR and the measuring laser beam LXM makes two round trips between the reference mirror 22X and the plane mirror 17X. In this embodiment, explanation has been exemplarily made for the case in which the position of the reticle stage 11 in the X direction is detected by the laser interferometer 43X. However, the position is also detected in the same manner as described above with other laser interferometers 43Y, 44X, 44Y which are used in the projection exposure apparatus of the embodiment of the present invention.

In the projection exposure apparatus of the embodiment of the present invention, in order to correct the rotation error $\theta$ (rad) about the axis parallel to the Z axis between the reticle R and the wafer W during the scanning exposure, the finely movable stage 9 is rotated in a minute amount with respect to the reticle stage 11 to perform the correction in some cases. In such a case, assuming that the distance between the plane mirror 17X and the mirror 18X is L, the reflected laser beam is deviated in the Y direction by 4L·θ when the double-pass interference system is used. For this reason, in this embodiment, the point of radiation on the plane mirror 17X for the measuring laser beam LXM of the laser interferometer 43X on the reticle side is made to be lower than the movement plane 14a. Accordingly, the plane mirror 17X is arranged in the vicinity of the reference mirror 22X to shorten the optical traveling distance of the laser interferometer 43X. Thus, the position of the finely movable stage 9 (reticle stage 11) on the basis of the projection optical system 5 can be measured highly accurately.

Figure 3:
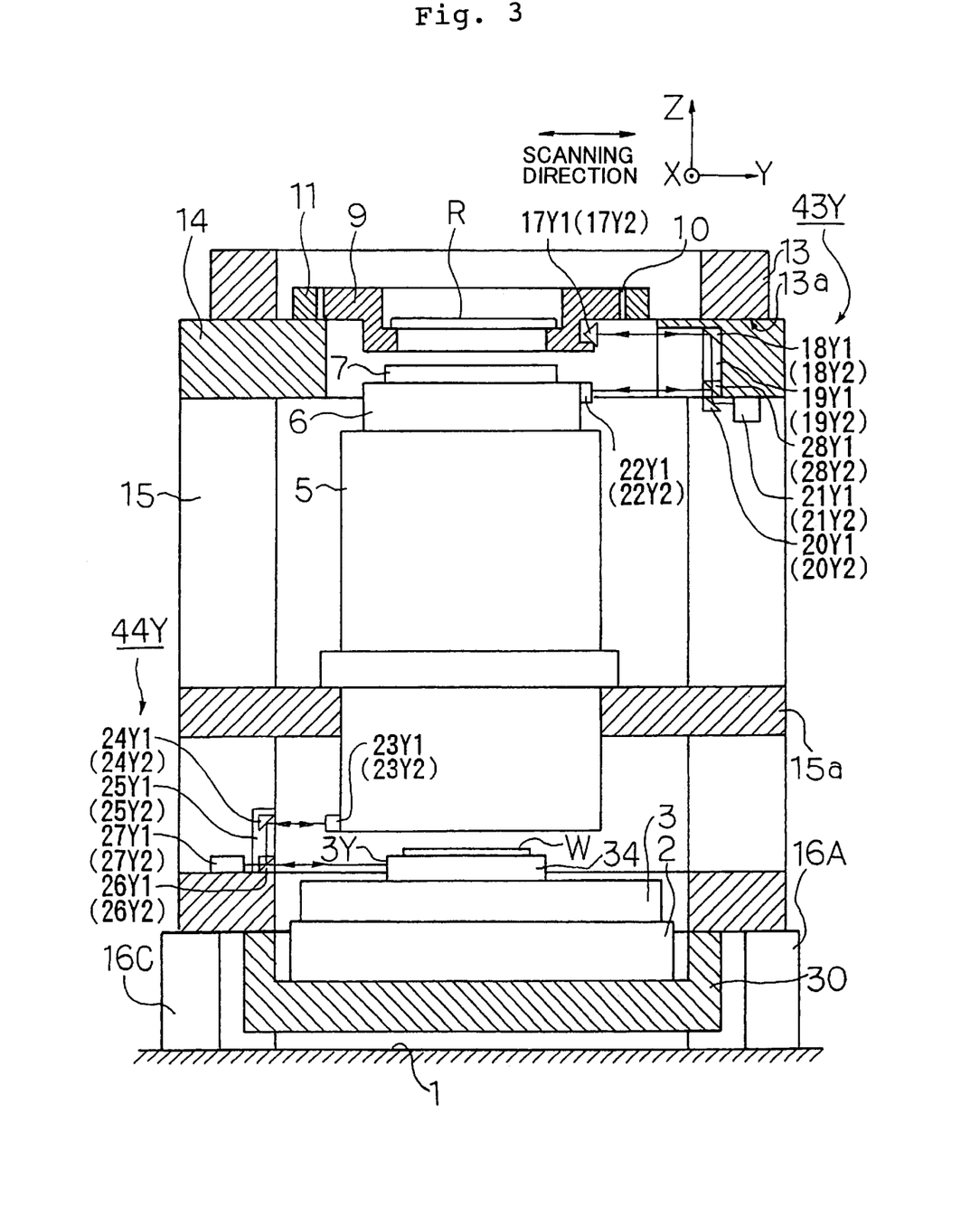
FIG. 3 shows a partial sectional view illustrating the finely movable stage 9 and a laser interferometer for detecting the position of the sample base 34 in the Y direction.

Next, FIG. 3 shows a sectional view obtained when a part of the projection exposure apparatus of this embodiment is cut along a plane perpendicular to the X axis with reference to FIG. 3, two corner cubes 17Y1, 17Y2, which serve as movement mirrors, are provided at a predetermined spacing distance in the X direction on the side surface in the +Y direction at the projection of the bottom surface of the finely movable stage 9 disposed at the inside of the reticle stage 11 so that the corner cubes 17Y1, 17Y2 are located at positions lower than the movement plane of the reticle base 14 (toward the projection optical system 5). The position of the finely movable stage 9 (reticle R) in the Y direction (scanning direction) is measured by the laser interferometer 43Y for the Y axis, the corner cubes 17Y1, 17Y2, and reference mirrors 22Y1, 22Y2 composed of plane mirrors provided on the upper end side surface of the body tube of the telecentric control unit 6 of the projection optical system 5. The laser interferometer 43Y is composed of two sets of laser interferometers so that not only the position of the finely movable stage 9 in the Y direction but also the angle of rotation about the axis parallel to the Z axis may be measured. That is, the laser interferometer 43Y is a laser interferometer based on the double-pass system comprising main laser interferometer bodies 21Y1, 21Y2, mirrors 20Y1, 20Y2, polarizing beam splitters 28Y1, 28Y2, light-feeding optical members 19Y1, 19Y2, and mirrors 18Y1, 18Y2.

The side surface of the sample base 34 in the −Y direction on the wafer stage 3 is also processed to have a mirror surface 3Y in the same manner as the mirror surface 3X in the X direction (see FIG. 2). The position of the sample base 34 in the Y direction is measured at two places which are separated from each other by a predetermined spacing distance in the X direction by means of the laser interferometer 44Y, the mirror surface 3Y as a movement mirror of the sample base 34, and reference mirrors 23Y1, 23Y2 provided on the side surface in the −Y direction at the lower portion of the body tube of the projection optical system 5. That is, the laser interferometer 44Y is also a laser interferometer composed of two sets based on the double-pass system comprising main laser interferometer bodies 27Y1, 27Y2, polarizing beam splitters 26Y1, 26Y2, light-feeding optical members 25Y1, 25Y2, and mirrors 24Y1, 24Y2, in the same manner as the laser interferometer 44X for the X axis.

In this arrangement, the optical axis of the two-axis measuring laser beam of each of the laser interferometer 44X for the X axis and the laser interferometer 44Y for the Y axis passes through the center of the exposure area IUW (optical axis of the projection optical system 5) as shown in FIG. 4a. No Abbe error is generated even when the sample base 34 is rotated.

In the projection exposure apparatus of this embodiment, the reticle stage 11 is only finely driven, and it is scarcely moved in the non-scanning direction (X direction). Therefore, the corner cubes 17Y1, 17Y2 are used as the movement mirrors in the scanning direction (Y direction). Accordingly, even when the finely movable stage 9 is finely rotated in a state in which the reticle stage 11 is greatly moved in the Y direction, no error is generated for the detected position of the finely movable stage 9 (reticle R).

The movement mirrors (plane mirror 17X, corner cubes 17Y1, 17Y2) are provided at the positions lower than the movement plane 14a for the reticle stage 11 on the reticle base 14. Accordingly, the reference mirrors 22X, 22Y1, 22Y2 are installed on the side surface of the projection optical system 5, and thus it is possible to measure the relative positional relationship between the reticle R and the projection optical system 5. It is possible to perform the positional adjustment for the reticle R and the wafer W highly accurately. The installation place for the reference mirrors 22X, 22Y1, 22Y2 is not limited to the side surface of the body tube of the projection optical system 5. The reference mirrors may be installed, for example, on the column 15 which supports the projection optical system 5.

In this embodiment, the two sets of laser interferometers are installed while being separated from each other by the predetermined spacing distance in the X direction or in the Y direction. Thus, it is possible to measure the angle of rotation about the Z axis (yawing) of the finely movable stage 9 (reticle R) or the sample base 34 (wafer W). Further, it is desirable to correct the error caused by the rotation such that the two sets of laser interferometers are installed at the positions separated from each other by a predetermined spacing distance in the Z direction to make it possible to measure the angle of rotation about the X axis (pitching) of the finely movable stage 9 (reticle R) or the sample base 34 (wafer W) and the angle of rotation about the Y axis (rolling) as well.

In this embodiment, as understood from FIGS. 2 and 3, the points of radiation of the measuring laser beam onto the corner cubes 17Y1, 17Y2 and the plane mirror 17X as the movement mirror are located substantially on an extension line of the pattern plane of the reticle R. Therefore, no Abbe error is generated even when the reticle R is inclined. However, even when the point of radiation of the measuring laser beam is installed on the extension line of the pattern plane of the reticle R, any error may be generated in the detected position of the finely movable stage 9 (reticle stage 11), because the distance between the movement mirror and the reference mirror is too long. In such a case, the following arrangement is desirably adopted. That is, the point of radiation of the measuring laser beam is installed at a position further lower than the pattern plane of the reticle R. Another laser interferometer for measuring the pitching and the rolling of the finely movable stage 9 is installed at a predetermined spacing distance in the Z direction so that the Abbe error caused by the rotation may be corrected.

Figure 5:
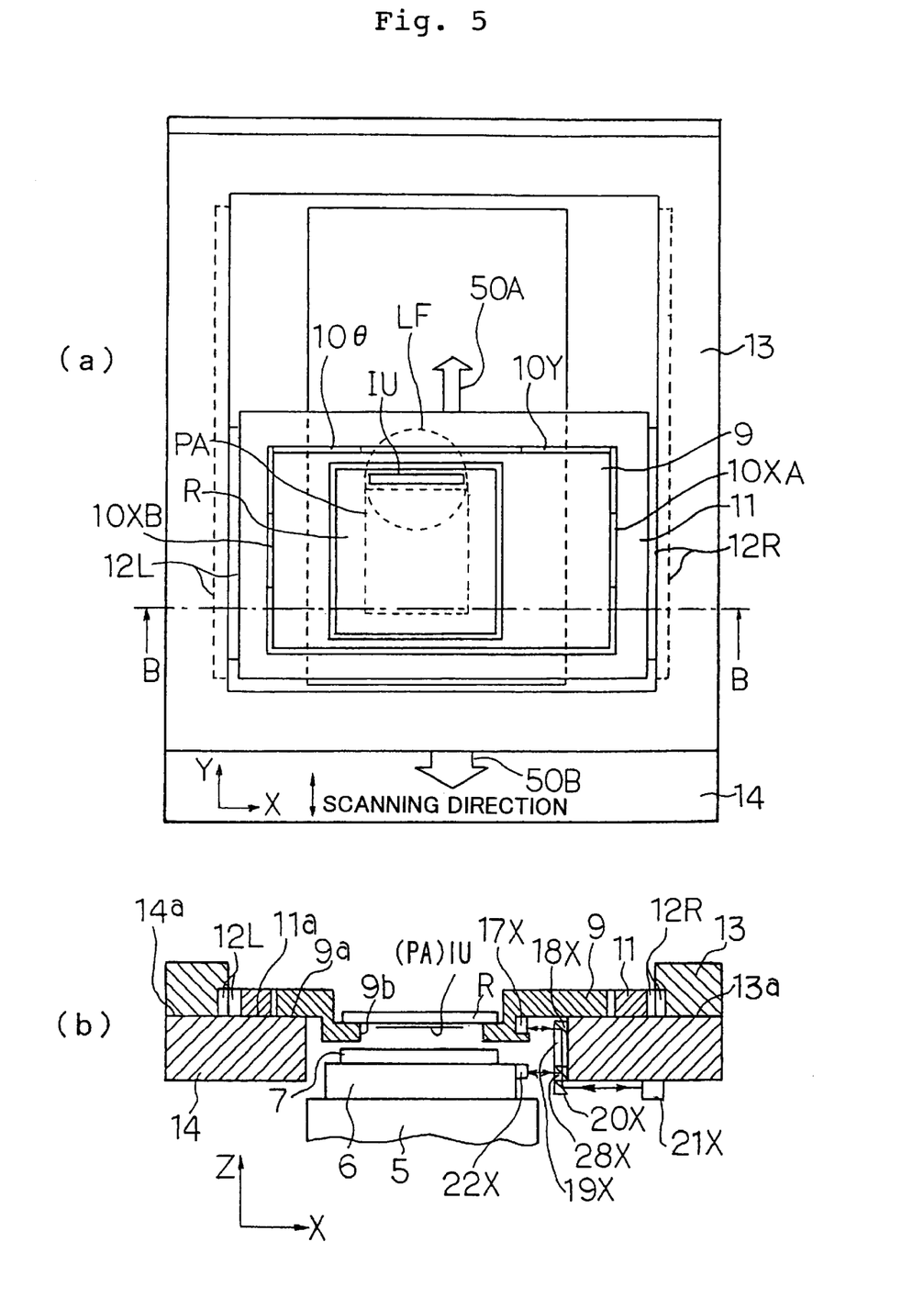
FIG. 5(a) shows a plan view illustrating, for example, a reticle stage 11 on a reticle base 14 of the projection exposure apparatus shown in FIG. 1.
FIG. 5(b) shows a sectional view taken along a line B—B shown in FIG. 5(a).
Figure 6:
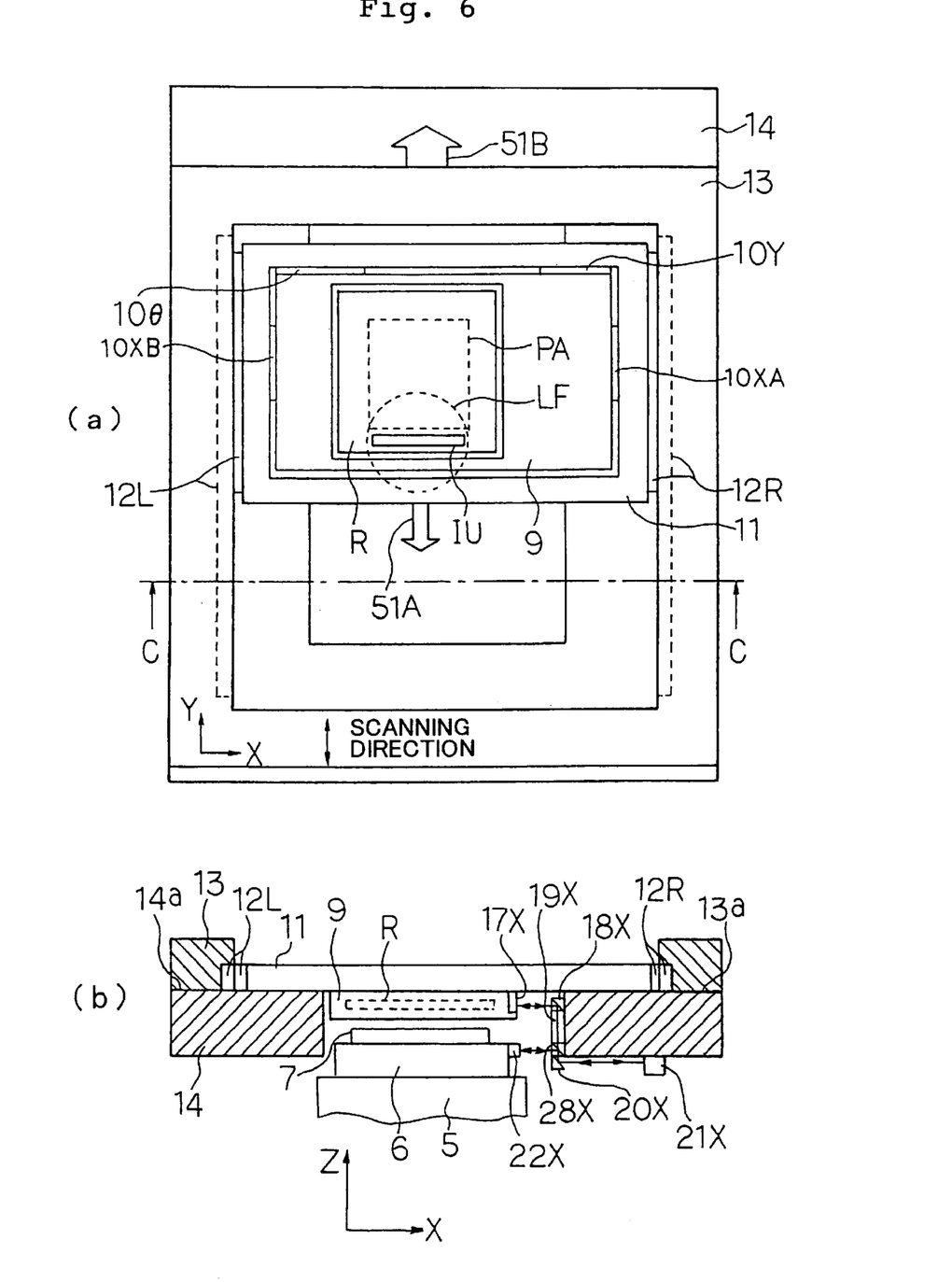
FIG. 6(a) shows a plan view illustrating a state in which the reticle stage 11 is driven in an opposite direction with respect to FIG. 5(a)
FIG. 6(b) shows a sectional view taken along a line C—C shown in FIG. 6(a).

Next, explanation will be made with reference to FIGS. 5 and 6 for a mechanism for reducing the driving reaction force on the side of the reticle stage 11 of the projection exposure apparatus of this embodiment.

FIG. 5a shows a plan view illustrating the stage system including the reticle stage 11. With reference to FIG. 5a, stators, which include coils of a pair of linear motors 12L, 12R for driving the reticle stage 11 in the Y direction, are installed on the inner side surfaces in the X direction of the reticle frame 13 having a large rectangular frame-shaped configuration. The stators are opposed to rotators which include permanent magnets of the pair of linear motors 12L, 12R provided on the outer side surfaces in the X direction of the reticle stage 11. Driving members 10XA, 10XB, 10Y, 10θ, which are based on the EI core system for finely driving the finely movable stage 9 for holding the reticle R in the X direction, the Y direction, and the rotational direction (θ direction), are installed on the inner surface of the reticle stage 11 having a rectangular frame-shaped configuration. Permanent magnets, which serve as driving objects, are arranged on the outer surface of the finely movable stage 9 so that the permanent magnets are opposed to the respective driving members. The driving members 10XA, 10XB, 10Y, 10θ are used to finely drive the finely movable stage 9 in the X direction, the Y direction, and the θ direction with respect to the reticle stage 11. Accordingly, it is possible to highly accurately correct the synchronization error between the reticle R and the wafer W during the scanning exposure.

FIG. 5b shows a sectional view taken along a line B—B shown in FIG. 5a. In FIG. 5b, the bottom surface 9a of the finely movable stage 9, the bottom surface 11a of the reticle stage 11, and the bottom surface 13a of the reticle frame 13 are supported by the aid of unillustrated air pads (static pressure pneumatic bearings) respectively so that they are movable smoothly in a non-contact state over the movement plane 14a of the reticle base 14. Alternatively, the respective stages 9, 11 and the reticle frame 13 on the reticle base 14 may be magnetically floated over the movement plane 14a by using electromagnets.

During the scanning exposure, the pattern area PA of the reticle R is subjected to scanning in the +Y direction or in the −Y direction with respect to the rectangular illumination area IU which inscribes the field LF of the projection optical system 5 on the side of the reticle R.

As shown in FIG. 5a, when the linear motors 12R, 12L are driven to move the reticle stage 11 in the direction of the arrow 50A (+Y direction) so that the pattern area PA of the reticle R is scanned with respect to the illumination area IU, then the reticle frame 13 is moved in the direction of the arrow 50B (−Y direction) in accordance with the law of action and reaction of the linear motors 12R, 12L, and the driving reaction force of the reticle stage 11 is offset. High rigidity is obtained owing to the repulsive force of the electromagnets of the driving members 10XA, 10XB, 10Y, 10θ between the finely movable stage 9 and the reticle stage 11. Therefore, the finely movable stage 9 and the reticle stage 11 can be integrally moved in the Y direction by using the thrust force brought about by the linear motors 12L, 12R. As shown in FIG. 6a, when the reticle stage 11 is moved in the direction of the arrow 51A (−Y direction), then the reticle frame 13 is moved in the direction of the arrow 51B (+Y direction) in accordance with the reaction of the linear motors 12R, 12L, and the driving reaction force of the reticle stage 11 is offset.

As described above, the reticle frame 13 is moved to offset the driving reaction force of the reticle stage 11 in the direction opposite to the movement direction of the reticle stage 11. Accordingly, it is possible to reduce the influence of the driving reaction force of the reticle stage 11 on the entire projection exposure apparatus including the reticle base 14. Even when the projection optical system 5 and the reticle base 14 are supported by the column 15, the vibration, which is caused by the movement of the reticle stage, is not transmitted to the projection optical system 5. Further, the variation of the center of gravity almost disappears on the reticle base 14. Therefore, an advantage is obtained such that the stability of the reticle stage 11 is improved. The reticle base 14 may be supported by a column which is independent from the column 15 concerning the vibration.

Figure 4:
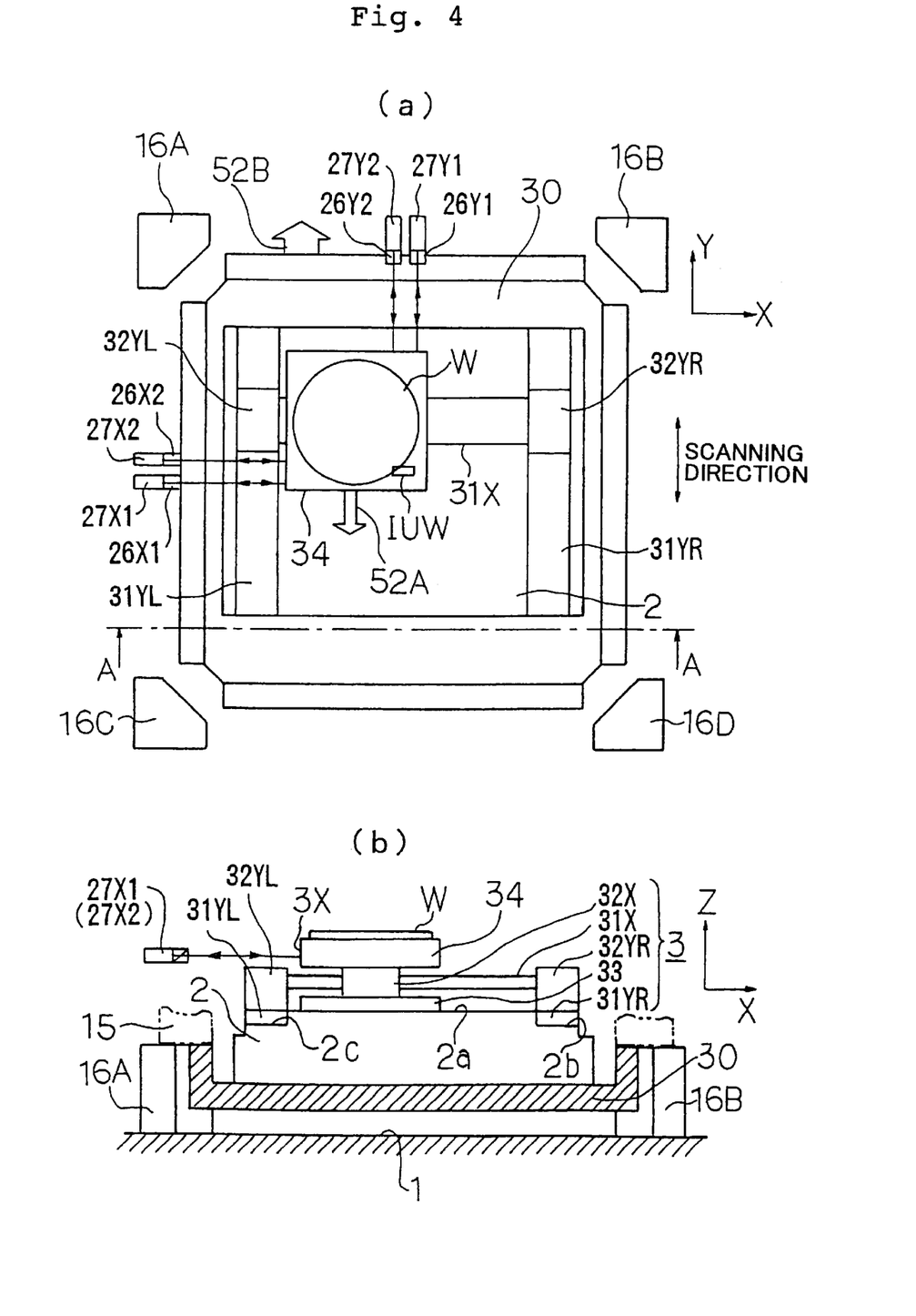
FIG. 4(a) shows, for example, a wafer stage 3 on a wafer base 30 of the projection exposure apparatus shown in FIG. 1.
FIG. 4(b) shows a sectional view taken along a line A—A shown in FIG. 4(a).

Next, explanation will be made with reference to FIG. 4 for a mechanism for reducing the driving reaction force for the wafer stage 3 and other components of this embodiment.

FIG. 4a shows a plan view illustrating the stage system including the wafer stage 3. FIG. 4b shows a sectional view taken along a line A—A shown in FIG. 4a. With reference to FIG. 4b, the upper surface of the wafer base 30 having a square plate-shaped configuration, which hangs from the column 15, is finished to be a flat surface having an extremely high flatness. The wafer frame 2 for offsetting the driving reaction force of the sample base 34 and the wafer stage 3 is placed on the upper surface of the wafer base 30 by the aid of unillustrated air pads in a non-contact state so that the wafer frame 2 is movable in the X direction and in the Y direction. Stators of a pair of linear motors 31YL, 31YR for moving the sample base 34 (wafer W) and other components in the Y direction are fixed to stepped sections 2b disposed on both sides in the X direction on the wafer frame 2. Y axis driving members 32YL, 32YR, which are provided with rotators including permanent magnets of the linear motors, are placed movably in the Y direction along the linear motors 31YL, 31YR. The Y axis driving members 32YL, 32YR interpose a stator including a coil of a linear motor 31X for moving the sample base 34 in the X direction by the aid of an unillustrated flexure (connecting member capable of making displacement or rotation in an arbitrary direction elastically to some extent).

An X axis driving member 32X, which is provided with a permanent magnet as a rotator, is placed movably in the X direction on the wafer frame 2 so that the linear motor 31X is interposed in the Y direction. The sample base 34 is placed on the X axis driving member 32X. The wafer W is attracted and held on the sample base 34 by the aid of an unillustrated wafer holder. A pad member 33, which serves as a static pressure pneumatic bearing, is installed between the X axis driving member 32X and the wafer frame 2. The pad member 33 is installed over the movement plane 2a on the wafer frame 2 in a non-contact state, making it possible to move the X axis driving member 32X (sample base 34) smoothly at a high speed. The wafer stage 3 is constructed by the linear motors 31X, 31YL, 31YR, the driving members 32X, 32YL, 32YR for the X axis and the Y axis, and the pad member 33.

With reference to FIG. 4a, when the sample base 34 is driven in the direction of the arrow 52A (−Y direction) in order to scan the wafer W with respect to an exposure area IUW during the scanning exposure, the sample base 34, the pad member 33, and the driving members 32X, 32YL, 32YR for the X axis and the Y axis are integrally moved with respect to the wafer frame 2 by driving the linear motors 31YR, 31YL. During this process, the wafer frame 2 is moved in the direction of the arrow 52B (+Y direction) in accordance with the reaction of the linear motors 31YR, 31YL, and the driving reaction force of the sample base 34 is offset, in the same manner as in the case in which the reticle stage 11 is driven. When the sample base 34 is moved in a stepping manner in the +X direction (or in the −X direction), the sample base 34, the pad member 33, and the X axis driving member 32X are integrally moved by driving the linear motor 31X. Also during this process, the wafer frame 2 is moved in the −X direction (or in the +X direction) in accordance with the reaction of the linear motor 31X, and the driving reaction force of the sample base 34 of offset. The principle of the reduction of the driving reaction force in this case is also applicable to the stepping movement of a projection exposure apparatus of the full field exposure system as it is.

As described above, the wafer frame 2 is moved in the direction opposite to the movement direction of the sample base 34 so that the driving reaction force of the sample base 34 is offset. Accordingly, it is possible to reduce the influence of the driving reaction force of the sample base 34 on the entire projection exposure apparatus including the wafer base 30. Therefore, even when the projection optical system 5 and the wafer base 30 are supported by the column 15, the vibration, which is caused by the movement of the wafer stage 3, is not transmitted to the projection optical system 5. Therefore, it is possible to realize the highly accurate exposure. It is not unnecessarily indispensable to support the wafer base by the column 15. For example, the wafer base may be supported by a column which is independent from (isolated from) the column 15 concerning the vibration. Further, the variation of the center of gravity almost disappears on the wafer base 30. Therefore, an advantage is obtained such that the stability of the wafer stage 3 is improved. A member for reducing the driving reaction force of the wafer stage such as the wafer frame 2 may be installed without increasing the footprint also in the case of a stage system in which the wafer W is moved over a two-dimensionally wide range as in the case of the wafer stage 3, by stacking and installing the wafer stage 3 and the wafer frame 2.

Next, explanation will be made with reference to FIG. 7 for the driving reaction force generated when the reticle stage 11 (finely movable stage 9) and the sample base 34 (wafer stage 3) are driven.

Figure 7:
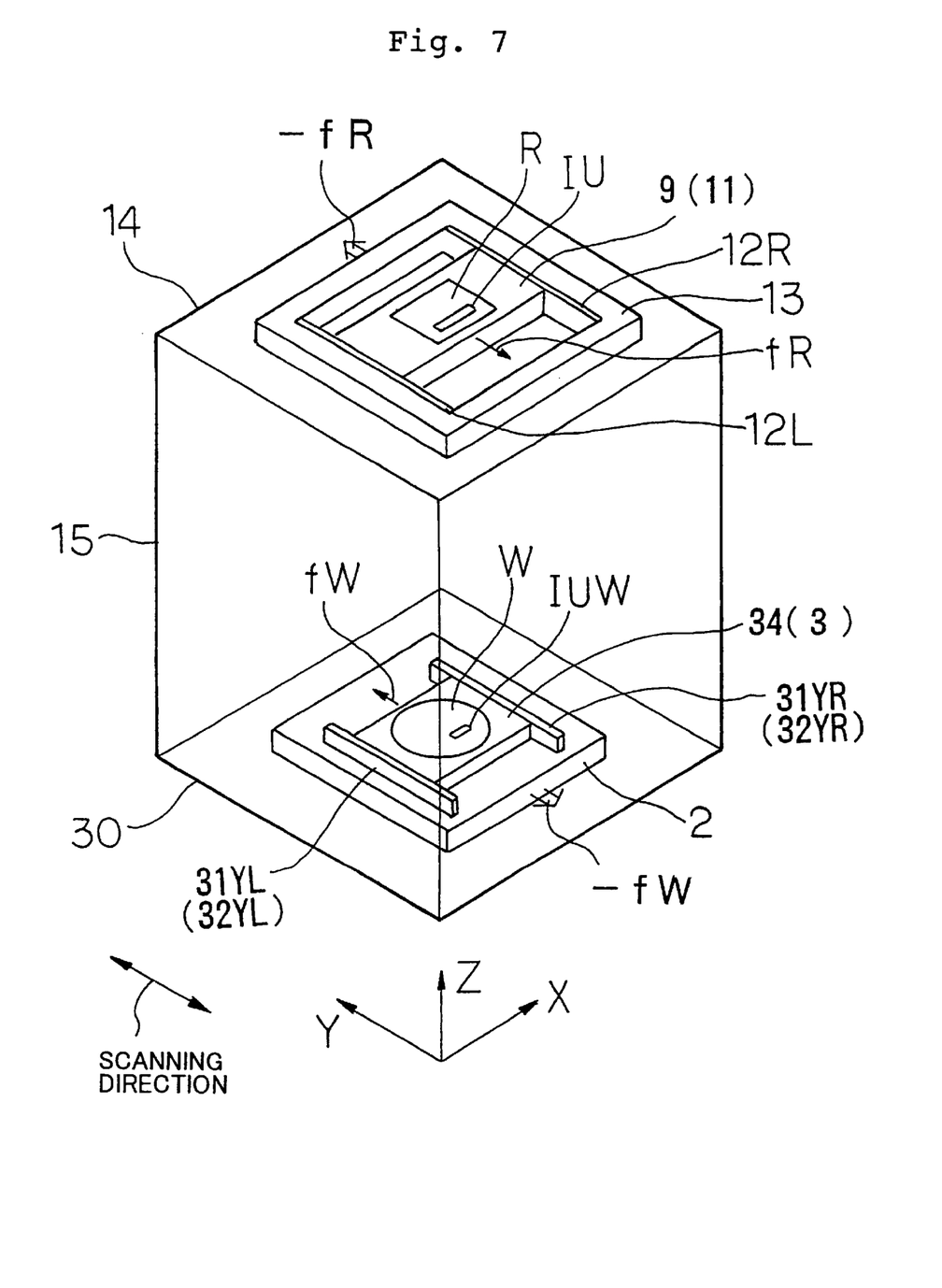
FIG. 7 shows a perspective view illustrating a stage system of the projection exposure apparatus shown in FIG. 1 in a simplified manner.

FIG. 7 shows the stage system of this embodiment in a simplified manner. With reference to FIG. 7, when the reticle stage 11 is driven in the +Y direction at a rate of acceleration $a_{RS}$ (m/s$^2$) with respect to the reticle frame 13 by the aid of the linear motors 12L, 12R installed on the inner surfaces of the reticle frame 13, the thrust force fR (N) represented by the following expression is generated in the +Y direction for the reticle stage 11.

$$fR = m_{RS} \times a_{RS} \quad (1)$$

In this expression, $m_{RS}$ (kg) represents a total mass of the reticle stage 11, the finely movable stage 9, and the reticle R. In this embodiment, when the reticle stage 11 is driven, the thrust force -fR is generated for the reticle frame 13 in the direction opposite to the movement direction of the reticle stage 11 as a result of the reaction (i.e., the driving reaction force) of the linear motors 12R, 12L. That is, the following expression holds assuming that $a_{RF}$ (m/s$^2$) represents the rate of acceleration of the reticle frame 13 with respect to the reticle base 14 in the -Y direction.

$$-fR = m_{RF} \times a_{RF} \quad (2)$$

In this expression, $m_{RF}$ (kg) represents a mass of the reticle frame 13. That is, the rate of acceleration is decreased in inverse proportion to the mass, and the movement amount is also decreased, because the absolute value fR of the thrust force is identical. The overall momentum (velocity×mass) is approximately maintained to be zero which is the value of the initial state in accordance with the law of conservation of momentum. Therefore, there is no movement of the center of gravity as a whole. The reticle stage 11 and the reticle frame 13 are accelerated for an identical period of time t. The respective stages 9, 11 and the reticle frame 13 on the reticle base 14 are supported by the air pads respectively. It can be regarded that little friction occurs when the respective stages 9, 11 and the reticle frame 13 on the reticle base 14 are driven. Therefore, assuming that the relative velocity of the reticle frame 13 with respect to the reticle base 14 is $V_{RF}$ (m/s), the relative velocity $v_{RS}$ (m/s) of the reticle stage 11 with respect to the reticle frame 13 and the relative velocity $v_R$ (m/s) of the reticle stage 11 with respect to the reticle base 14 are represented by the following expressions respectively.

$$V_R = -m_{RF} \times v_{RF}/m_{RS} \quad (3)$$

$$V_R = v_{RS} + v_{RF} \quad (4)$$

The reticle stage 11 and the reticle frame 13 are moved in the mutually opposite directions. Therefore, when it is intended to increase the relative velocity $v_R$ of the reticle stage 11 with respect to the reticle base 14, for example, during the scanning exposure, it is desirable to increase the ratio of the mass $m_{RF}$ of the reticle frame 13 with respect to the mass $m_{RS}$ of the reticle stage 11. In this case, the following advantage is obtained. That is, the relative velocity $v_R$ of the reticle stage 11 with respect to the reticle base 14 can be increased, as well as it is enough to give a small driving amount of the reticle frame 13. However, if the reticle frame 13 has too heavy weight, the weight of the upper portion of the column 15 becomes too large, which is not desirable. Accordingly, it is desirable that the mass $m_{RF}$ of the reticle frame 13 is about not less than five times and not more than twenty times the mass $m_{RS}$ of the reticle stage 11 (including the reticle R and the finely movable stage 9). For example, the former mass $m_{RF}$ is set to be about ten times the latter mass $m_{RS}$.

On the other hand, when the sample base 34 on the wafer stage 3 and the wafer stage 3 are driven in the -Y direction at a rate of acceleration $a_{RS}$ (m/s$^2$) with respect to the wafer frame 2 by the aid of the linear motors 31YL, 31YR, the thrust force fW (N) represented by the following expression is generated in the -Y direction.

$$fW = m_{WS} \times a_{WS} \quad (5)$$

However, when the wafer W is moved in the Y direction, the sample base 34 (wafer W), the linear motor 31X, the driving members 32X, 32YL, 32YR for the X axis and the Y axis, and the air pad 33 are moved in an integrated manner. Therefore, $m_{WS}$ (kg) is a total mass of these members. Further, the thrust force -fW (N) for driving the wafer frame 2 at a rate of acceleration $a_{RF}$ (m/s$^2$) with respect to the wafer base 30 in the direction (+Y direction) opposite to the movement direction of the sample base 34 is generated in the -Y direction, as the reaction (i.e., the driving reaction force) of the linear motors 31YR, 31YL when the sample base 34 is driven, in the same manner as in the driving of the reticle stage 11.

$$-fW = m_{WF} \times a_{WF} \quad (6)$$

However, $m_{WF}$ (kg) represents a total mass of the wafer frame 2 and the stators of the linear motors 31YL, 31YR. Also in this case, the overall momentum (velocity x mass) is conserved to be approximately zero. Further, the absolute value of the thrust force is identical. When the member having a larger mass, then its rate of acceleration is small, and its amount of movement is small as well. The sample base 34 and the wafer frame 2 are accelerated for an identical period of time t. Therefore, assuming that the relative velocity of the wafer frame 2 with respect to the wafer base 30 is $v_{WF}$ (m/s), the relative velocity $v_{WS}$ (m/s) of the sample base 34 with respect to the wafer frame 2 and the relative velocity $v_W$ (m/s) of the sample base 34 with respect to the wafer base 30 are represented by the following expressions.

$$v_{WS} = -m_{WF} \times v_{WF}/m_{WS} \quad (7)$$

$$v_W = v_{WS} + v_{WF} \quad (8)$$

The sample base 34 and the wafer frame 2 are moved in the mutually opposite directions in the same manner as in the reticle stage 11. Therefore, when it is intended to increase the relative velocity $v_W$ of the sample base 34 (wafer W) with respect to the wafer base 30, for example, it is desirable to increase the ratio of the mass $m_{WF}$ of the wafer frame 2 with respect to the mass $m_{WS}$ of the sample base 24. In this case, the following advantage is obtained. That is, the relative velocity $v_W$ of the sample base 34 with respect to the wafer base 30 can be increased, as well as it is enough to give a small driving amount of the wafer frame 2. Further, it is desirable that the mass $m_{WF}$ of the wafer frame 2 is about not less than five times and not more than twenty times the mass $m_{WS}$ of the sample base 34. For example, the former mass $m_{WF}$ is set to be about ten times the latter mass $m_{WS}$.

The relationship between the movement velocity $v_W$ of the sample base 34 and the movement velocity $v_{WF}$ of the wafer frame 2 when the sample base 34 is moved in the X direction in the stepping manner is represented by the expressions (7) and (8) in the same manner as the case in which the sample base 34 is moved in the X direction. However, when the sample base 34 is moved in the X direction in the stepping manner, the linear motor 31X and the Y axis driving members 32YL, 32YR are fixed on the wafer frame 2, unlike the case in which the sample base 34 is moved in the Y direction. Therefore, the mass $m_{WS}$ in the expression (7) is the total mass of the sample base 34, the wafer W, the X axis driving member 32X, and the air pad 33. The mass $m_{WF}$ is the total mass of the wafer frame 2, the linear motors 31X, 31YL, 31YR, and the Y axis driving members 32YL, 32YR.

In the embodiment described above, the projection optical system 5, the reticle base 14, and the wafer base 30 are installed on the common column 15. However, the reticle base 14 and the wafer base 30, and the projection optical system 5 may be supported by different columns so that the focus positions on the reticle side and the wafer side with respect to the projection optical system 5 may be independently controlled for the respective columns. In this arrangement, the reticle base 14 and the wafer base 30, and the projection optical system 5 are supported by the separate columns. Therefore, it is possible to reduce the influence of the driving reaction force of the reticle stage 11 or the wafer stage 3, for example, on the projection optical system 5.

In this embodiment, the refraction type projection optical system, which is constructed by only refraction lenses, is used as the projection optical system 5. However, the present invention is also applicable to a projection exposure apparatus based on the use of a projection optical system of the reflection-refraction type (cata-dioptric type) constructed by combining refraction lenses and reflection optical elements such as concave mirrors.

The present invention is also applicable to an exposure apparatus which uses a reflection type reticle as the reticle, as a scanning type exposure apparatus which uses the EUV (Extreme Ultra Violet) light beam such as the soft X-ray as the exposure light beam. When the reflection type reticle is used, the reference mirror and the movement mirror on the reticle side can be arranged closely to one another according to the present invention. Therefore, the effect is especially remarkable. Further, the stage mechanism of the present invention is also applicable, for example, to a wafer stage of an electron beam transfer apparatus.

The stage mechanism of the present invention is not limited to the embodiment described above, which is also applicable to a charged particle beam transfer apparatus for drawing a predetermined pattern by using a charged particle beam as in an electron beam drawing apparatus. When the electron beam is used, an electronic optical system composed of an electronic lens and a deflector may be used as an optical system. It is needless to say that the optical path, through which the electron beam passes, is in a vacuum state. For example, when the electron beam is used, it is possible to use, as an electron gun, thermionic emission type lanthanum hexaboride ($LaB_6$) and tantalum (Ta).

The stage mechanism of the embodiment of the present invention is also applicable to a proximity exposure apparatus in which a pattern on a mask is subjected to exposure while making tight contact between the mask and a substrate without using the projection optical system.

A high harmonic wave may be used as the illumination light beam for the exposure, which is obtained such that a single wavelength laser in the infrared region or in the visible region, which is oscillated from a DFB semiconductor laser or a fiber laser, is amplified, for example, with a fiber amplifier doped with erbium (Er) (or both of erbium and ytterbium (Yb)), followed by wavelength conversion into an ultraviolet light beam by using nonlinear optical crystal.

When the far ultraviolet ray such as the excimer laser is used, a material such as quartz ($SiO_2$) and fluorite ($CaF_2$) through which the far ultraviolet ray is transmitted, is used as a saltpeter material for the projection optical system or the like. As for the magnification of the projection optical system, there is no limitation to the reduction system. It is allowable to use either a 1x magnification type or a magnifying system.

The way of use of the exposure apparatus of the embodiment described above is not limited to the exposure apparatus for producing semiconductors. Wide application is available, for example, to an exposure apparatus for liquid crystals in which an angular glass plate is exposed with a liquid crystal display element pattern, and an exposure apparatus for producing thin film magnetic heads.

The exposure apparatus of the embodiment of the present invention can be produced by incorporating the projection optical system and the illumination optical system composed of a plurality of lenses into the main exposure apparatus body to perform optical adjustment, and attaching, for example, the reticle stage, the wafer stage, and the laser interferometers composed of a large number of mechanical parts to the main exposure apparatus body to connect wirings and piping thereto, followed by overall adjustment (for example, electric adjustment and confirmation of operation). It is desirable that the production of the exposure apparatus is performed in a clean room in which, for example, the temperature and the cleanness are managed.

The semiconductor device is produced by performing, for example, a step of designing the function and the performance of the device, a step of producing a reticle based on the foregoing step, a step of manufacturing a wafer from a silicon material, a step of exposing the wafer with a pattern on the reticle by using the exposure apparatus of the embodiment described above, and a step of assembling the device (including steps of dicing, bonding, and packaging).

The present invention is not limited to the embodiment described above, which may be embodied in other various forms without deviating from the gist or essential characteristics of the present invention. Further, the contents of all disclosure of Japanese Patent Application No. 10-169720 filed on Jun. 17, 1998 including the specification, claims, drawings, and abstract are incorporated herein by reference.

According to the first exposure apparatus and the first exposure method of the present invention, the relative positional relationship between the mask and the projection optical system can be detected. The relative positional relationship between the mask and the substrate can be maintained to be constant, and it is possible to effect the positional adjustment between the mask and the substrate highly accurately.

According to the second exposure apparatus and the second exposure method of the present invention, it is possible to reduce the influence of the driving reaction force of the mask stage, for example, on the positioning accuracy. The exposure can be performed highly accurately.

According to the third exposure apparatus and the third exposure method of the present invention, it is possible to reduce the influence of the driving reaction force of the substrate stage, for example, on the positioning accuracy.

According to the fourth exposure apparatus and the fourth exposure method of the present invention, the mask and the projection optical system can be arranged closely to one another. It is possible to make the design so that the working distance on the mask side is short.

According to the method for producing the device of the present invention, the mask and the substrate are subjected to the positional adjustment highly accurately by using the exposure apparatus of the present invention. As a result, it is possible to obtain the high performance device.

What is claimed is:

1. An exposure apparatus for exposing a substrate with an image of a pattern on a mask via a projection optical system, comprising:

a mask stage which is supported movably with respect to a base member and which is movable in a predetermined direction while holding the mask, the mask stage having a reflective portion;

a mask side reaction force-reducing member which is supported movably with respect to the base member at the outside of the mask stage and which is movable to offset any reaction force generated when the mask stage is driven, the mask side reaction force-reducing member being disposed above the reflective portion of the mask stage;

an interferometer which radiates a measuring beam to the reflective portion to detect a position of the mask stage; and a driving member which is arranged between the mask stage and the mask side reaction force-reducing member and which drives the mask stage, wherein:
   the mask stage includes a first stage member which is movable in a predetermined direction; and a second stage member which is movable in the predetermined direction together with the first stage member while holding the mask and which is finely movable with respect to the first stage member in a plane parallel to a plane of the base member on which the mask stage is moved, so that a position of the mask is adjusted.

2. The exposure apparatus according to claim 1, wherein a mass of the mask side reaction force-reducing member is not less than five times a mass of the mask stage.

3. The exposure apparatus according to claim 1, further comprising a support member which supports the base member and the projection optical system.

4. A method for producing a predetermined device, comprising the step of transferring, by exposure, a pattern onto a substrate by using the exposure apparatus as defined in claim 1.

5. The exposure apparatus according to claim 1, wherein the second stage member has the reflective portion.

6. The exposure apparatus according to claim 1, wherein the mask side reaction force-reducing member is of a rectangular shape.

7. An exposure method for exposing a substrate with an image of a pattern on a mask via a projection optical system, comprising:

moving a mask stage including a first stage member which is supported movably with respect to a base member and a second stage member which is movable together with the first stage member and holds the mask, while moving a mask side reaction force-reducing member, which is supported movably with respect to the base member and which is arranged at the outside of the first stage member to offset any driving reaction force of the mask stage;

finely moving the second stage member with respect to the first stage member in a plane which is parallel to a plane of the base member on which the mask stage is moved so that a position of the mask is adjusted; and irradiating a measuring beam to a reflective portion of the second stage to detect a position of the mask, the reflective portion of the second stage being disposed below the mask side reaction force-reducing member.

8. The exposure method according to claim 7, wherein the base member and the projection optical system are supported by a common support member.

9. A method for producing an exposure apparatus for exposing a substrate with an image of a pattern on a mask via a projection optical system, the method comprising assembling the following components in a predetermined positional relationship:

a mask stage including a first stage member which is movable in a predetermined direction and a second stage member which is movable in the predetermined direction together with the first stage member while holding the mask and which is finely movable with respect to the first stage member, in a plane parallel to a plane on which the first stage member is moved, to adjust a position of the mask;

a mask side reaction force-reducing member which is movable to offset any reaction force generated when the mask stage is driven, at the outside of the mask stage;

a driving member which is arranged between the mask stage and the mask side reaction force-reducing member and which drives the mask stage; and an interferometer which radiates a measuring beam to a reflective portion of the second stage to detect a position of the second stage, the reflective portion of the second stage being disposed below the mask side reaction force-reducing member.

10. The method for producing the exposure apparatus according to claim 9, wherein:

the mask stage is supported movably by a mask base; and
   the mask base and the projection optical system are supported by an identical support member.

11. An exposure apparatus which exposes a pattern of a mask, comprising:
- a mask stage which moves while holding the mask, the mask stage having a reflective portion;
- a reaction force-reducing member disposed outside of the mask stage which moves in a direction opposite to the direction of movement of the mask stage, the reaction force-reducing member being disposed above the reflective portion of the mask stage;
- a driver having a first portion connected to the mask stage and a second portion connected to the reaction force-reducing member to move the mask stage; and
- a position detector which radiates a measuring beam to the reflective portion of the mask stage to detect a position of the mask stage.

12. The exposure apparatus according to claim 11, wherein the mask stage is movably supported by a base.

13. The exposure apparatus according to claim 11, wherein the reaction force-reducing member is movably supported by a base.

14. The exposure apparatus according to claim 11, wherein the position detector comprises an interferometer.

15. The exposure apparatus according to claim 11, wherein the reaction force-reducing member is of a rectangular shape.

16. A stage apparatus comprising:
- a movable stage having a reflective portion;
- a reaction force-reducing member disposed outside of the movable stage which moves in a direction opposite to the direction of movement of the movable stage, the reaction force-reducing member being disposed above the reflective portion of the movable stage;
- a driver having a first portion connected to the movable stage and a second portion connected to the reaction force-reducing member to move the movable stage; and
- a position detector which radiates a measuring beam to the reflective portion of the movable stage to detect a position of the movable stage.

17. The stage apparatus according to claim 16, wherein the movable stage is movably supported by a base.

18. The stage apparatus according to claim 16, wherein the reaction force-reducing member is movably supported by a base.

19. The stage apparatus according to claim 16, wherein the position detector comprises an interferometer.

20. The stage apparatus according to claim 16, wherein the reaction force-reducing member is of rectangular shape.

\* \* \* \* \*